United States Patent
Taira

(10) Patent No.: US 6,638,779 B2
(45) Date of Patent: Oct. 28, 2003

(54) FABRICATION METHOD OF SEMICONDUCTOR INTEGRATED CIRCUIT DEVICE AND TESTING METHOD

(75) Inventor: Tomohiro Taira, Chitose (JP)

(73) Assignees: Hitachi, Ltd., Tokyo (JP); Hitachi Hokkai Semiconductor, Ltd., Hokkaido (JP)

(*) Notice: Subject to any disclaimer, the term of this patent is extended or adjusted under 35 U.S.C. 154(b) by 0 days.

(21) Appl. No.: 10/096,801

(22) Filed: Mar. 14, 2002

(65) Prior Publication Data

US 2002/0132381 A1 Sep. 19, 2002

(30) Foreign Application Priority Data

Mar. 16, 2001 (JP) .......................... 2001-075671

(51) Int. Cl.[7] .............................................. G01R 31/26
(52) U.S. Cl. ....................................................... 438/17
(58) Field of Search ........................ 324/765; 438/14, 438/15, 111, 17; 257/48, 697; 716/19

(56) References Cited

U.S. PATENT DOCUMENTS 6,124,725 A * 9/2000 Sato .......................... 324/765
6,137,303 A * 10/2000 Deckert ....................... 324/765

FOREIGN PATENT DOCUMENTS

JP    5-136219    6/1993   ........... H01L/21/66
JP    5-343497    12/1993  ........... H01L/21/68

OTHER PUBLICATIONS

Patent Abstracts of Japan 05136219 Jun. 1, 1993.
Patents Abstracts of Japan 05343497 Dec. 24, 1993.

* cited by examiner

Primary Examiner—John F. Niebling
Assistant Examiner—Andre C Stevenson
(74) Attorney, Agent, or Firm—Antonelli, Terry, Stout & Kraus, LLP

(57) ABSTRACT

A probe inspection system is used in integrated circuit fabrication and testing, using a network, including probers, testers, manufacturing specification management, testing step control and test results management, which has a modified prober software. Lots are set successively to cassettes, and when the lot in another cassette is set after the end of processing of the lot in one cassette, processing of the next lot is executed automatically. Continuous lot inspection can be effected by repeating these operations. Even during processing of the next lot, it is always possible to change lot in the processing-completed cassette and input data, such as lot No. In probe check in wafer testing, it is possible to diminish the working load and the waiting of workers in the lot change, reduce the number of cassettes and improve the working efficiency of testers.

3 Claims, 13 Drawing Sheets

FABRICATION METHOD OF SEMICONDUCTOR INTEGRATED CIRCUIT DEVICE AND TESTING METHOD

BACKGROUND OF THE INVENTION

The present invention relates to a technique for fabricating a semiconductor integrated circuit device; and, more particularly, the invention relates to a technique which is effective in its application to a wafer testing step, including a probe check.

According to studies made by the present inventor in connection with the fabrication of a semiconductor integrated circuit device, for example, it has been found that Japanese Unexamined Patent Publication Nos. Hei 5(1993)-343497 and 5(1993)-136219 disclose techniques associated with a wafer testing step, including a probe check.

For example, in the former publication No. Hei 5(1993)-343497, there is disclosed wafer inspection equipment provided with plural wafer inspection units and a cassette stock unit, wherein wafers stored in a predetermined cassette, out of plural cassettes stocked in the cassette stock unit, are taken out one by one from the cassette and conveyed for inspection to the plural wafer inspection units, respectively, by wafer conveyance means, and then they are conveyed successively, beginning with one that has been checked in any of the wafer inspection units, to the original cassette and are received therein.

In the latter publication No. Hei 5(1993)-136219, there is disclosed inspection equipment provided with plural inspection mechanisms and a probe card conveying mechanism, wherein inspection is carried out under successive loading and unloading of wafers with respect to the plural inspection mechanisms, and a predetermined probe card is conveyed and automatically loaded to each inspection mechanism by the probe card conveying mechanism in accordance with the type of wafer, thereby allowing inspection to be carried out.

SUMMARY OF THE INVENTION

Having studied the above techniques concerning wafer testing including a probe check, the present inventor has found the following facts.

For example, according to the technique disclosed in the former publication No. Hei 5(1993)-343497, plural cassettes and plural wafer inspection units are controlled in a centralized manner, so that many wafers received in a predetermined cassette are conveyed to an empty wafer inspection unit and checked therein, thereby shortening the inspection time required for each cassette. This technique is suitable mainly for limited item mass production, but is not considered suitable for multiple-item production. Particularly, no consideration is given in the publication to the application of the testing technique to a variety of items for each wafer inspection unit, nor is any consideration given to the replacement of test programs corresponding to various items.

According to the technique disclosed in the latter publication No. Hei 5(1993)-136219, a predetermined probe card is conveyed to each inspection mechanism in accordance with the type of wafer and inspection is carried out, whereby, in a multi-item low-volume production, the inspection of a wafer is also carried out efficiently so as to improve the production efficiency. In this technique, a correlation is specified between an inspection mechanism and a probe card in accordance with the type of wafer, and it is necessary to provide inspection mechanisms and probe cards in a number corresponding to the number of items, so that the scale of inspection equipment may become large. Besides, no consideration is given either to the application to a variety of items for each wafer inspection unit, or to the replacement of test programs corresponding to various items. Moreover, the wafer conveying unit used becomes larger in scale, giving rise to problems from the point of view of investment and space.

Further, in such a probe check, in the wafer testing step as referred to above, wafers are set into a prober in the unit of a lot, and a program is loaded to carry out a probe check. In this case, the lot is exchanged upon completion of one lot inspection; and, if a change of program is necessary for the new lot, a program is re-loaded manually to cope with a multi-item inspection. Since the inspection is thus carried out lot by lot, there are working loads, such as raising and lowering lots and changing program; besides, this imposes a wait on the worker, with consequent lowering of the working efficiency of the tester. Additionally, a maximum of twenty-five wafers can usually be received in one cassette, but in a multi-item production, there sometimes is a case where the number of items is one and the number of wafers is small. Since management is carried out in the unit of one lot and one cassette, the number of cassettes increases, leading to an increase of the working load and a lowering of the working efficiency. One lot No. covers one fixed item or it may cover a plurality of items.

In view of the above-mentioned point, the present inventor has hit upon forming a network which covers probers, testers, manufacturing specification management, testing step control and test result management and modification of the probe software. As a result, a large-scale wafer conveying unit is not needed, and by the application to various items in the unit of a prober and by automatic replacement of test programs corresponding to various items, it becomes possible to reduce the working load during lot replacement and reduce the number of cassettes; and, it further becomes possible to realize a probe check for plural lots, which leads to improvement in the working efficiency of the testers.

It is an object of the present invention to provide a semiconductor integrated circuit device fabricating method and a testing method which, in a probe check in a wafer testing step, can reduce the working load and the waiting time of a worker during lot replacement, reduce the number of cassettes and improve the tester working efficiency, and which permits application to a variety of items in the unit of a prober.

The above and other objects and novel features of the present invention will become more apparent from the following description and the accompanying drawings.

Typical aspects of the invention, out of those disclosed herein, will be outlined below.

According to the present invention, for achieving the above-mentioned object, a network is formed, including probers, testers, manufacturing specification management, testing step control and test results management, and the prober's software is modified, so that ① the manufacturing specification in a probe checking step is set under a unitary management (in terms of a data file) and manufacturing specification information in the probe check for each lot and each wafer in a cassette is fed to a tester, ② program selection, as well as a prober's item parameter and measurement temperature, are controlled automatically in the tester on the basis of the manufacturing specification information in the probe check, ③ the storage of probe check results to a storage medium (e.g. FD) is abolished in a test results acquiring network, and ④ by modification of the prober's software, a lot switching work is normally rendered automatic so as to reduce the working time and make the operation stop time zero, and the number of cassettes is reduced. There is no one-lot one-cassette limitation, with plural lots and plural items capable of being received in one cassette.

More specifically, in one aspect of the present invention, there is provided a semiconductor integrated circuit device fabricating method, including a wafer processing step of forming a predetermined integrated circuit on a wafer, a wafer testing step in which, after the end of processing of a predetermined cassette as one cassette out of plural cassettes, each accommodating the wafer with an integrated circuit formed thereon, the predetermined cassette is replaced with another cassette, and the wafer is subjected to an electrical characteristic test, and a product shipping step of shipping the wafer as a product, if it is judged to be non-defective as a result of the electrical characteristic test.

In another aspect of the present invention, there is provided a semiconductor integrated circuit device fabricating method wherein, as the wafer testing step, data of each lot and each wafer, in a cassette which accepts the item of the wafer with an integrated circuit formed thereon, are automatically replaced with a test program corresponding to each item in a unitarily managed state on a network with a representative lot No. as a key and the electrical characteristic test for the wafer is carried out; or, the same test is carried out while probe trace image data of a prober for the integrated circuit-formed wafer are checked off-line; or, when such wafers with the integrated circuit formed thereon are accommodated in plural items and plural lots into a cassette, an automatic change is made into test programs corresponding to the items, and the electrical characteristic test for the wafer is carried out.

In a further aspect of the present invention, there is provided a semiconductor integrated circuit device testing method, including a step of providing a wafer with a predetermined integrated circuit formed thereon, a step in which, after the end of processing of a predetermined cassette as one cassette out of plural cassettes, each accommodating the wafer with the integrated circuit formed thereon, the predetermined cassette is replaced with another cassette, and the wafer is subjected to an electrical characteristic test, and a step of shipping the wafer as a product, if it is judged to be non-defective as a result of the electrical characteristic test.

In a still further aspect of the present invention, there is provided a semiconductor integrated circuit device testing method wherein, as the step of carrying out the electrical characteristic test, data of each lot and each wafer, in a cassette which accepts the item of the wafer with the integrated circuit formed thereon, are automatically replaced with a test program corresponding to each item in a unitary managed state on a network with a representative lot No. as a key, and the electrical characteristic test for the wafer is carried out; or, the same test is carried out while probe trace image data of a prober for the integrated circuit-formed wafer are checked off-line; or, when such wafers with the integrated circuit formed thereon are accommodated in plural items and plural lots into a cassette, an automatic change is made into test programs corresponding to the items, and the electrical characteristic test for the wafer is carried out.

DETAILED DESCRIPTION OF PREFERRED EMBODIMENTS

Figure 1:
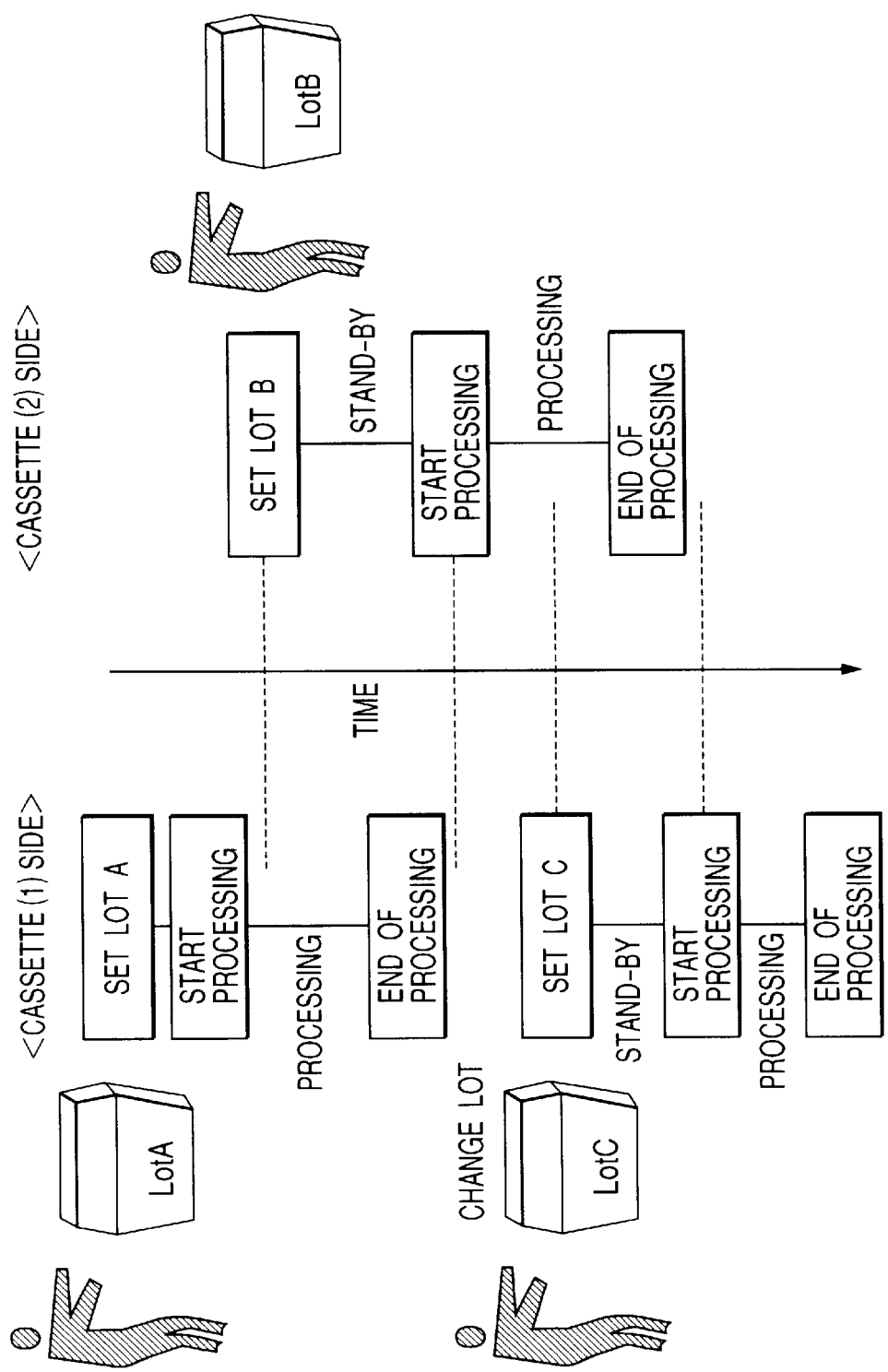
FIG. 1 is flow diagram showing a concept of continuous prober checking for lots in a wafer testing step in a semiconductor integrated circuit device fabricating method according to the present invention.

In the following description of the embodiments of the present invention, the same or similar portions once explained will not be explained repeatedly in principle except when repeated explanations are needed.

In the description of the following embodiments, explanations may be given of plural sections or plural embodiments when necessary for convenience' sake, but unless otherwise mentioned, it should be understood that they are not unrelated to each other, but are related such that one is a modification, detail, or supplemental explanation of a part or the whole of the other.

In the following embodiments, moreover, when reference is made to a number of elements (including a number of pieces, a numerical value, a quantity, and a range), no limitation is imposed on that specific number, but amounts above and below the specific number will also do unless limitation to the specific number is specially mentioned or is inevitable basically.

Further, it goes without saying that the components (including constituent steps) in the following embodiments are not always essential, except for the case where they are specially mentioned to be essential, or are clearly considered to be essential basically.

Likewise, it is to be understood that, when reference is made to the shapes and positional relations of components in the following embodiments, those substantially similar or closely similar to such shapes, etc. are also included unless otherwise mentioned or otherwise considered basically. This is also the case with the foregoing numerical values and ranges.

Embodiments of the present invention will be described in detail hereinunder with reference to the drawings. In all of the drawings, members having the same functions are identified by the same reference numerals and repeated explanations thereof will be omitted.

(1) The term "semiconductor integrated circuit device" as referred to herein covers not only those devices formed on a silicon wafer, but also those devices formed on other substrates, such as TFT liquid crystal, unless otherwise mentioned.

(2) The term "wafer" as referred to herein covers a generally disc-like or rectangular single crystal silicon wafer used in the manufacture of a semiconductor integrated circuit device, SOI, substrates having a composite structure with other insulating materials, a and glass substrate used in the manufacture of a TFT.

First, with reference to FIG. 1, an explanation will be given of an example of a concept of starting a continuous prober's check for lots in a wafer testing step in a method of fabricating a semiconductor integrated circuit device embodying the present invention. FIG. 1 is a flow diagram showing a concept of continuous prober checking for lots. In the illustrated example, lots A, B and C of different manufacturing specifications are subjected to processing in an arrangement having two cassettes which accommodate wafers on which integrated circuits to be measured have been found. It goes without saying that the example to be described is also applicable to a construction having three or more cassettes and the case where two or four or more types of lots are to be subjected to processing.

As shown in FIG. 1, when starting continuous prober checking for lots, first Lot A is set to the cassette (1) side and the processing thereof is started. During this processing of Lot A, Lot B is set to the cassette (2) side and assumes a stand-by state. When the processing of Lot A set to the cassette (1) side is complete, the processing of Lot B set to the cassette (2) side, which has been in a stand-by state, is started. During this processing of Lot B, the lot on the cassette (1) side is replaced, that is, Lot A is replaced with Lot C, and Lot C assumes a stand-by state. When the processing of Lot B set to the cassette (2) side is complete, the processing of Lot C set to the cassette (1) side, which has been in a stand-by state, is started in the same manner.

Thus, in the probe check in the wafer testing step according to the present invention, Lots A, B and C are set successively to the cassettes (1) and (2); and, after the end of lot processing in one cassette, the processing of the next lot, which has already been set in the other cassette, is carried out automatically. By repeating this operation, it is possible to effect a continuous processing of lots. Even during processing of the next lot, it is normally possible to carry out a lot change for the cassette whose processing has been completed and to effect a data input, such as a lot No. input.

Even when different types of lots are set to the same cassette, it is possible to perform lot switching automatically, thereby carrying out continuous lot checking, particularly in multi-item production, and to reduce the number of cassettes, by automatically controlling the selection of a test program for a tester, as well as a prober set temperature and item parameter, at the time of change of each lot and wafer corresponding to each lot and wafers managed lot by lot in each cassette and on the basis of fabricating specification information in a probe check, which information is unitarily managed on a network.

The term "lot" as referred to herein means handling the same item as one group in accordance with a semiconductor integrated circuit device fabricating specification. Likewise, "different lot" indicates a different item, and "switching lot" means switching to a lot having a different lot No. of a different or the same item.

Figure 2:
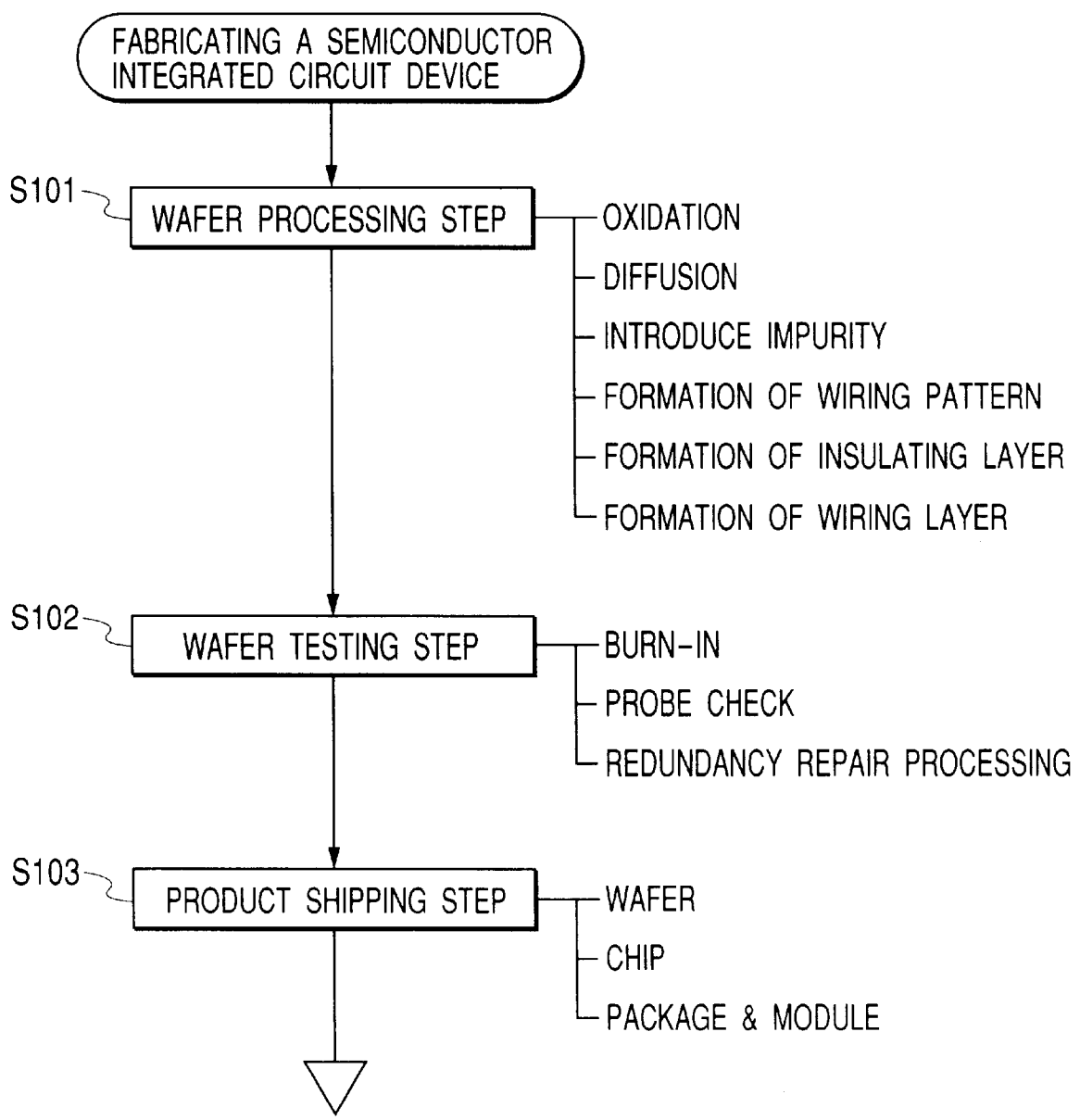
FIG. 2 is a flow chart showing a semiconductor integrated circuit device fabricating method embodying the present invention.

Next, an example of the semiconductor integrated circuit device fabricating method of this embodiment will be described with reference to FIG. 2, which is a flow chart showing a semiconductor integrated circuit device fabricating method.

(1) In a wafer processing step (S101), a logic device or a memory, or a predetermined integrated circuit formed as a combination of the two, is formed on a wafer. More specifically, in accordance with the specification of a semiconductor integrated circuit device, processings such as oxidation, diffusion, impurity introduction and formation of a wiring pattern, insulating layer and wiring layer, are repeated for the wafer in accordance with the specification of a semiconductor integrated circuit device to be formed, thereby forming an integrated circuit for each of plural chips disposed in a lattice arrangement on the wafer.

(2) In a wafer testing step (S102), the wafer which has gone through the wafer processing step is subjected to burn-in, a probe check, and redundancy repair processing. Burn-in is a test in which a rated or higher temperature and a voltage stress are applied for screening of a chip which is likely to become defective. In the probe check, a function test is carried out for checking whether a logic device or a memory, or an integrated circuit formed as a combination of the two, fulfills a predetermined function or not; and, an open/short test between input and output terminals, a leakage current test, a DC test, such as measurement of a supply current, and an AC test for testing an AC timing are carried out. The redundancy repair processing is carried out for repairing and relieving a chip judged to be defective as a result of the probe check, by the application of a laser beam, for example.

In accordance with the present invention, though the details will be described later, a characteristic feature resides in the probe check after the wafer testing step. In the prober and in one cassette out of plural cassettes, each containing wafers with an integrated circuit formed thereon, a predetermined cassette is replaced with another cassette after the end of processing of the predetermined cassette, and it is thereby made possible to continuously conduct an electrical characteristic test for the wafers.

(3) In a product shipping step (S103), wafers found to be non-defective as a result of the wafer testing step are shipped as products. The products include various forms of products, such as non-defective wafers as they are, single non-defective chips obtained by cutting each wafer into individual chips, and packages or modules obtained by assembling non-defective chips. The products can be offered to users as a semiconductor integrated circuit device in the state of a wafer, a chip, or a package or module.

Figure 3:
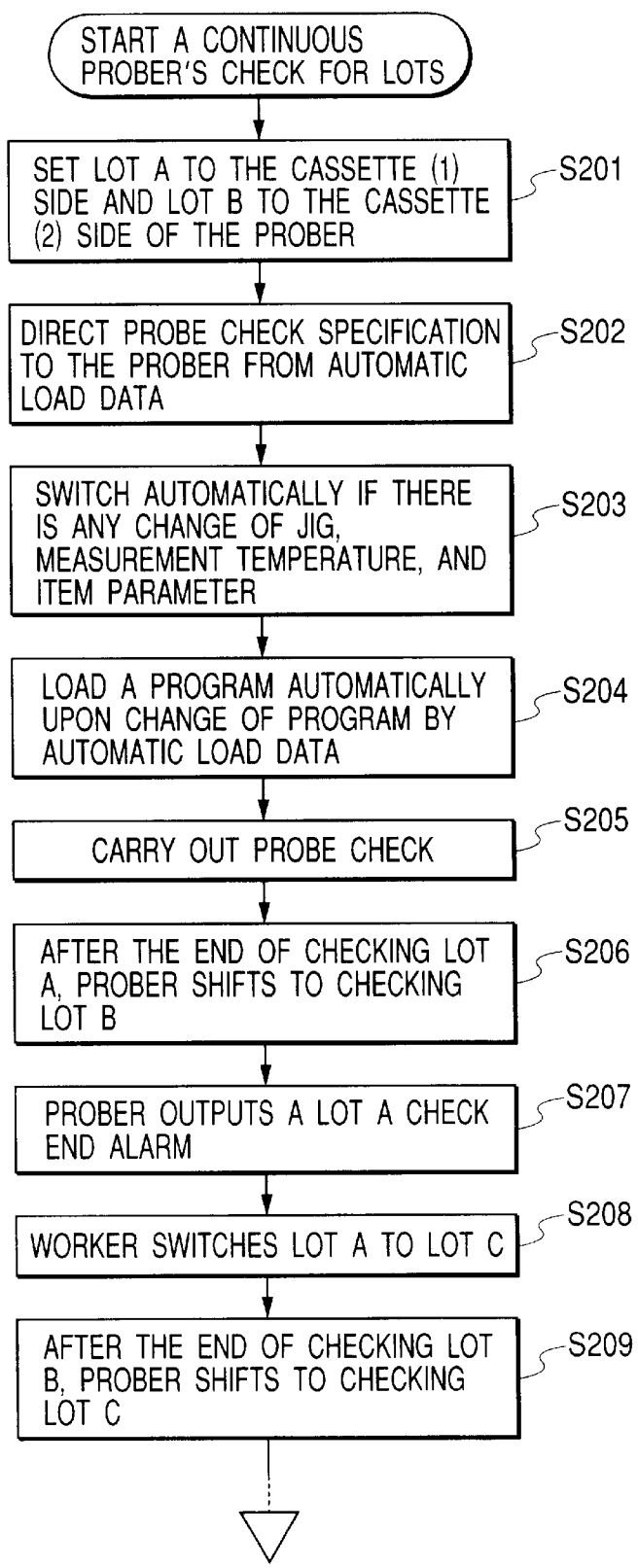
FIG. 3 is a flow chart showing a probe check in a semiconductor integrated circuit device testing method embodying the present invention.

Next, with reference to FIG. 3, a description will be given of an example of a probe check in the semiconductor integrated circuit device testing method of this embodiment. FIG. 3 is a flow chart showing the probe check used in the semiconductor integrated circuit device testing method. The illustrated example is of a construction having two cassettes—cassette (1) and cassette (2)—in starting a continuous prober checking for lots in the wafer testing step shown in FIG. 2.

(1) In step S201, Lot A and Lot B are set to the cassette (1) side and cassette (2) side, respectively, in a prober. Setting of Lot B is not always required to be simultaneous with that of Lot A.

(2) In step S202, a probe check specification is directed to the prober on the basis of automatic load data (manufacturing specification information such as jig, measurement temperature, and item parameter).

(3) In step S203, if there is any change of jig, measurement temperature, etc., switching is effected automatically.

(4) In step S204, a program is loaded automatically upon occurrence of a change of program by automatic load data.

(5) In step S205, a probe check is executed.

(6) In step S206, after the end of processing of Lot A, the prober shifts to processing of Lot B and executes the same processings as in the foregoing steps S202 to S205.

(7) In step S207, the prober issues an alarm indicating the end of processing of Lot A. This alarm is distinguished from other alarms, because a lowering of the tester working efficiency does not result even without immediate execution of processing.

(8) In step S208, the worker switches Lot A to Lot C.

(9) In step S209, after the end of processing of Lot B, the prober shifts to processing of Lot C and executes the same processings as in the foregoing steps S202 to S205.

Then, after the end of processing of Lot C, the prober shifts to processing of Lot D and, also for this and succeeding lots, repeats the same processings as in the foregoing steps S202 to S205.

In this way, Lots A, B, C, D, . . . are set successively to the cassettes (1) and (2), and if the other cassette is set after the end of processing of one cassette, the operation of processing of the next cassette is repeated automatically, whereby the lots set in the cassettes can be subjected to processing in a continuous manner.

In this connection, if wafers of one item of lot are accommodated in one cassette, the processing of each lot can be carried out cassette by cassette. On the other hand, if wafers of plural, two, for example, types of lots, like Lots A and B, are accommodated in one cassette, it is possible to perform lot switching automatically and to process each lot continuously by automatically controlling the selection of a prober's test program and measurement temperature at the time of a change from Lot A to Lot B corresponding to the lots which are managed lot by lot in the cassette. This is made possible because, in the automatic load data, the wafers received in each cassette are managed lot by lot.

Figure 4:
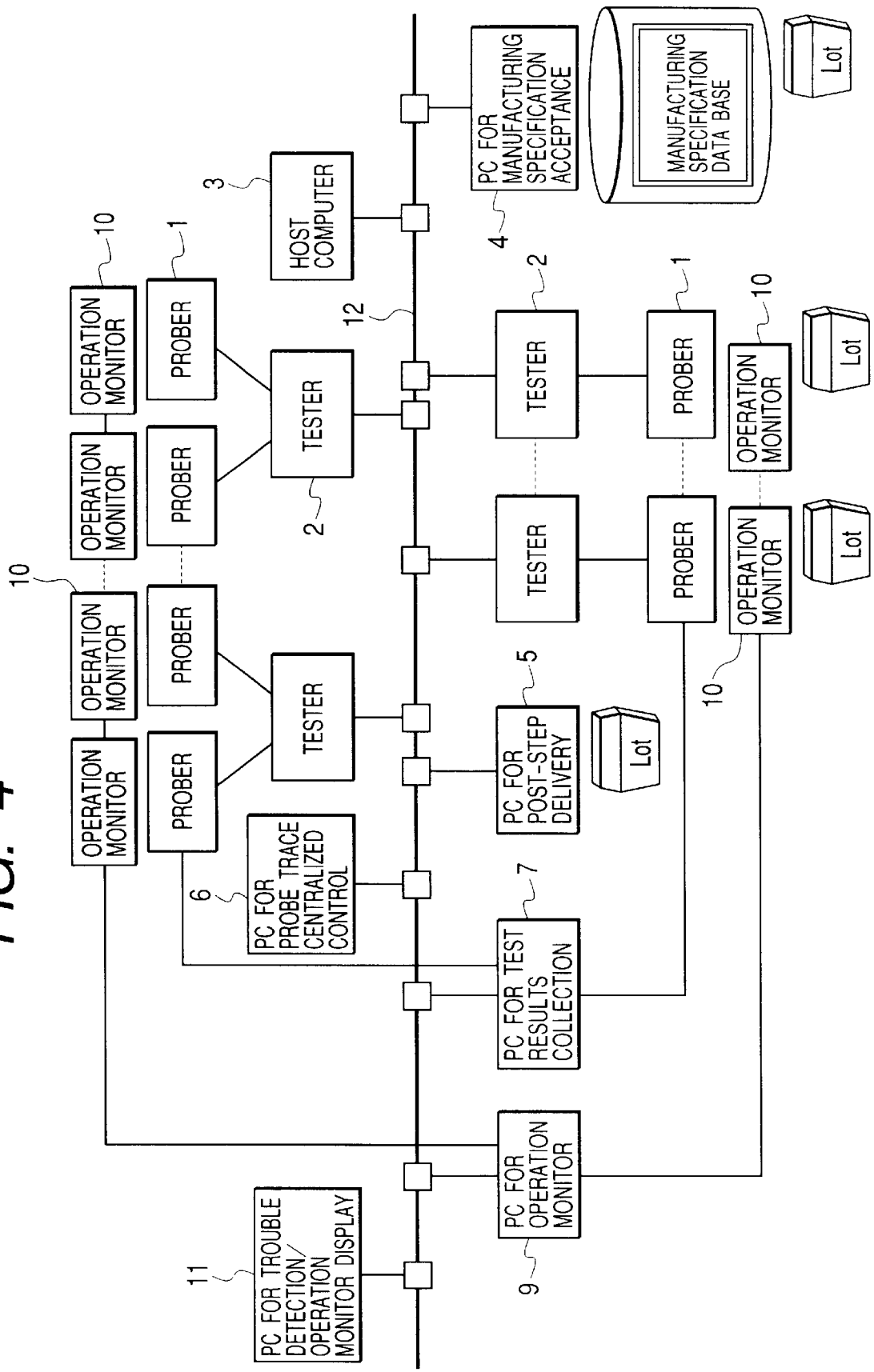
FIG. 4 is a block diagram showing a probe inspection system for effecting a probe check in the semiconductor integrated circuit device testing method embodying the present invention.

Next, with reference to FIG. 4, a description will be given of an example of a probe inspection system for realizing probe inspection in the semiconductor integrated circuit device testing method of this embodiment. FIG. 4 is a block diagram showing the probe inspection system.

As shown in FIG. 4, the probe inspection system according to this embodiment is composed of plural probers 1, plural testers 2, a host computer 3, a PC (personal computer) 4 for manufacturing specification acceptance, a PC 5 for post-step delivery, a PC 6 for probe trace centralized control, a PC 7 for test results collection, a PC 9 for an operation monitor, operation monitors 10, and a PC 11 for trouble detection/operation monitor display. The host computer 3 is connected through a network 12 to each of the testers 2, to PC 4 for manufacturing specification acceptance, to PC 5 for post-step delivery, to PC 6 for probe trace centralized control, to PC 7 for test results collection, to PC 9 for operation monitor, and to PC 11 for trouble detection/operation monitor display.

The plural probers 1 are of different types according to manufacturing specifications, including testing conditions of an electrical characteristic test or of the same type. One or plural probers 1 are connected to each tester 2. The probers 1 are each provided for testing, chip by chip, an electrical characteristic of a predetermined integrated circuit formed on a wafer in the wafer processing step. A probe of a probe card is brought into contact with an electrode of each chip and an electrical characteristic test for the chip is conducted with an external tester 2 connected to the probe.

The plural testers 2 are of different types corresponding to the probers 1, or they are of the same type. They are each connected to one or plural probers 1, and they are also connected to the network 12. The testers 2 are each loaded from the network 12 with a test program and a test pattern for testing an electrical characteristic of a wafer, and they judge, on the basis of the result of the test, whether each chip is non-defective or defective. The chips on the wafer are each judged and distinguished between being non-defective and defective each individually.

The host computer 3 is connected through the network 12 to each of the testers 2, to PC 4 for manufacturing specification acceptance, to PC 5 for post-step delivery, to PC 6 for probe trace centralized control, to PC 7 for test results collection, to PC 9 for an operation monitor, and to PC 11 for trouble detection/operation monitor display. For the entire probe inspection system, the host computer 3 stores automatic load data on a manufacturing specification from the PC 4 for manufacturing specification acceptance, and it also stores data associated with the electrical characteristic test, such as a test program, test pattern and test results. Each tester 2 and each PC are controlled for processing and calculation on the basis of automatic load data and test results.

The PC 4 for manufacturing specification acceptance is connected to the network 12, and it has a manufacturing specification data base and issues a control card (describing a process flow) used at the time of lot acceptance. To the manufacturing specification data base, there is inputted, product by product, a manufacturing specification comprising such data as a process flow associated with a probe check, a jig, a program, and a parameter name, which manufacturing specification is managed in a unitary manner. These data are inputted to the data base by reading a control card in which there is stored a manufacturing specification associated with the probe check, product by product. This manufacturing specification is filed, lot by lot, and is transmitted as automatic load data to the host computer 3. The contents of the automatic load data coincide with that of the manufacturing specification data base.

The PC 5 for post-step delivery is connected to the network 12 with the host computer 3 connected thereto. The PC 5 is used for outputting a pellet inspection slip, when delivering a wafer to a post-step after the end of a probe check, or for transmitting, over the network 12, the result of the test to the host computer which is on-lined to the post-step.

The PC 6 for probe trace centralized control is connected to the network 12 with the host computer 3 connected thereto. The PC 6 displays a probe trace image transmitted from a prober 1, sends to the prober 1 adjustment data obtained from the probe trace image, and confirms, modifies and controls a probing position in a centralized manner.

The PC 7 for test results collection is connected to the network 12 with the host computer 3 connected thereto. The PC 7 is used for collecting test results, wafer by wafer, and sending the test results to the host computer 3. It is possible to make reference to past test results in a real time manner. In case of transmitting test results from a tester 2 through the network 12, there is no transmission from the PC 7 for test results collection.

The PC 9 for an operation monitor is connected to the network 12 with the host computer 3 connected thereto, and it is also connected to the operation monitors 10 to transmit information from the operation monitors 10 to the host computer 3.

The operation monitors 10 are connected to the PC 9, and they are also connected to the probers 1 to transmit information, such as operation, fault and error stop of devices, including testers 2 and probers 1, to the host computer 3 through the PC 9 constantly in the probe inspection step.

The PC 11 for trouble detection/operation monitor display is connected to the network 12 with the host computer 3 connected thereto so as to produce a trouble detection display and an operation display after processing in the host computer on the basis of test results and operation information.

Figure 5:
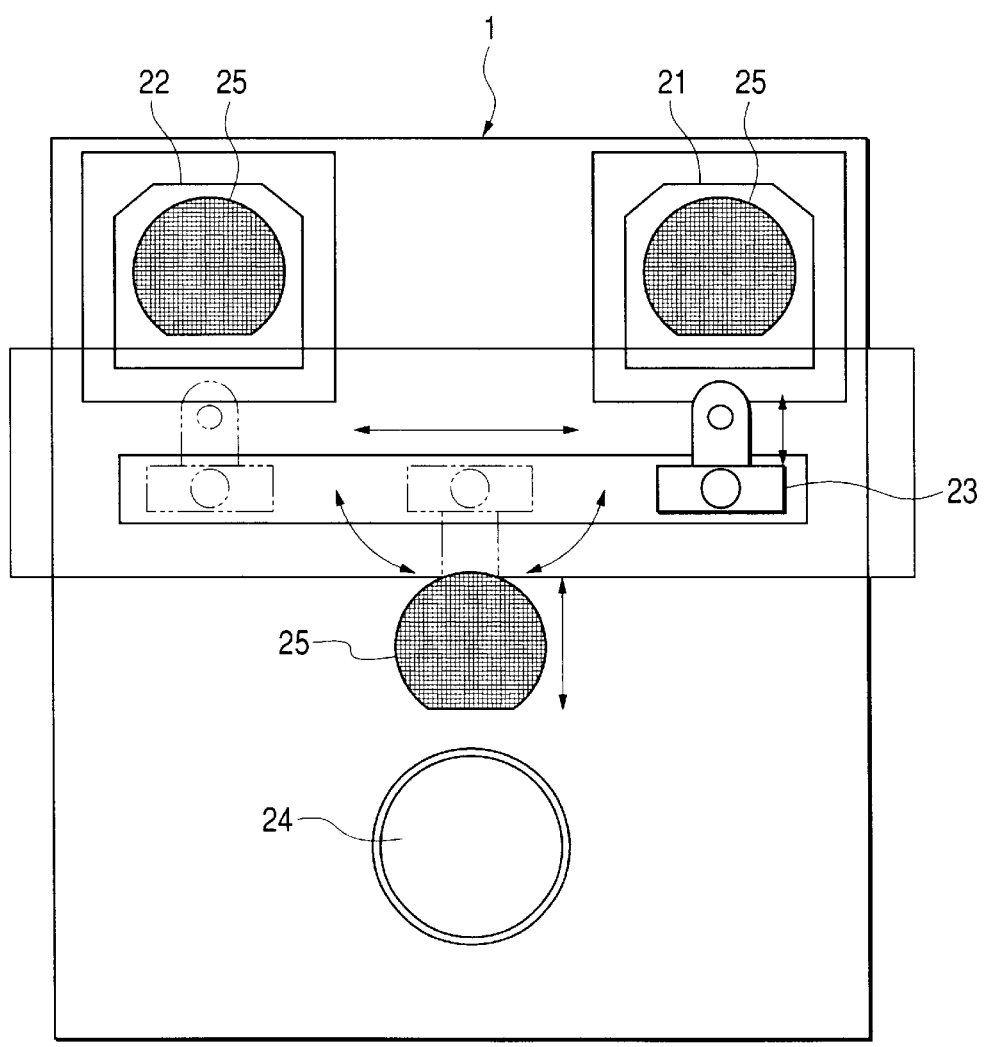
FIG. 5 is a diagram showing a top plan view of a prober which constitutes a probe inspection system embodying the present invention.
Figure 6:
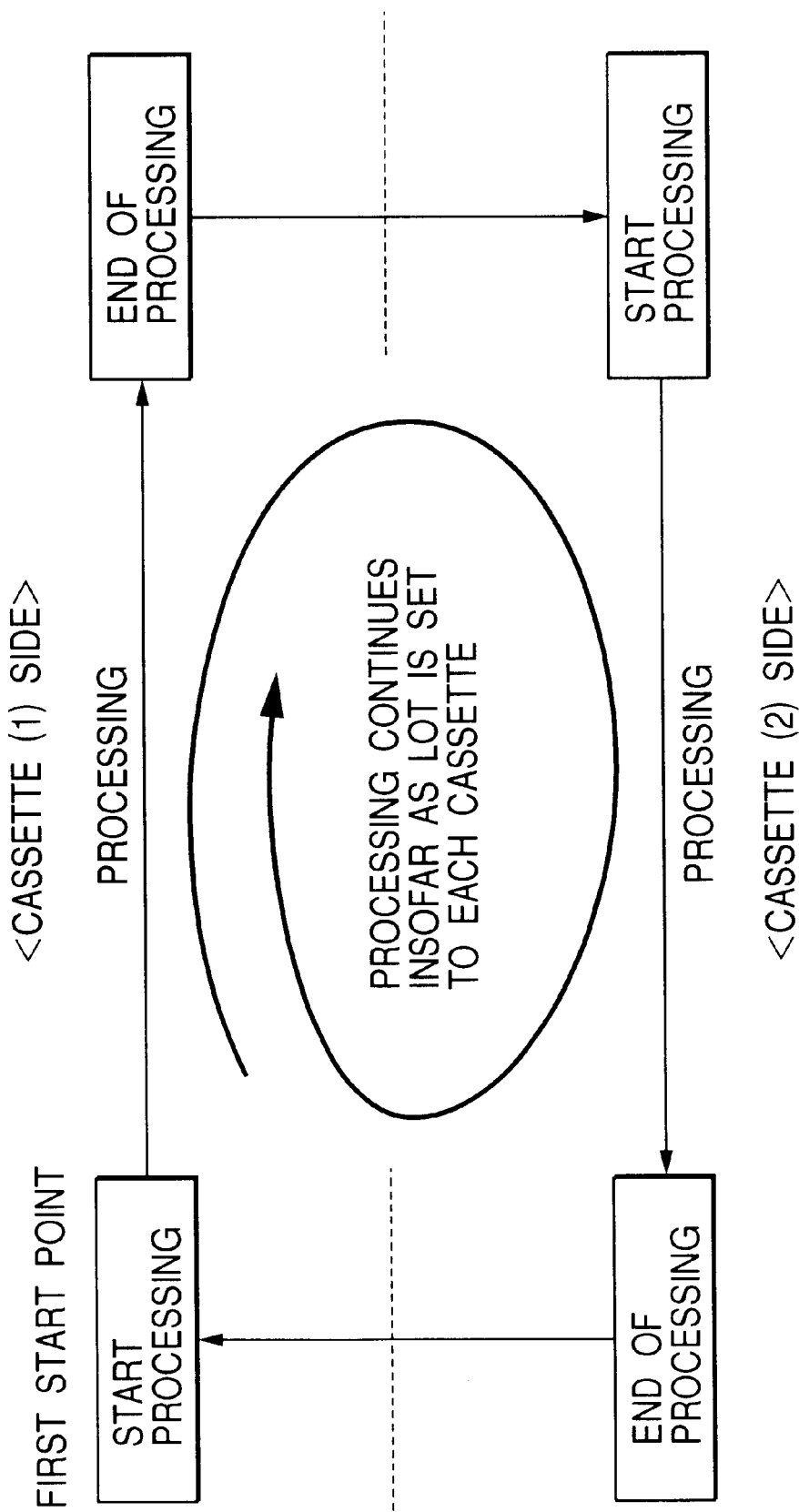
FIG. 6 is a diagram showing a flow of operations of the prober.
Figure 7:
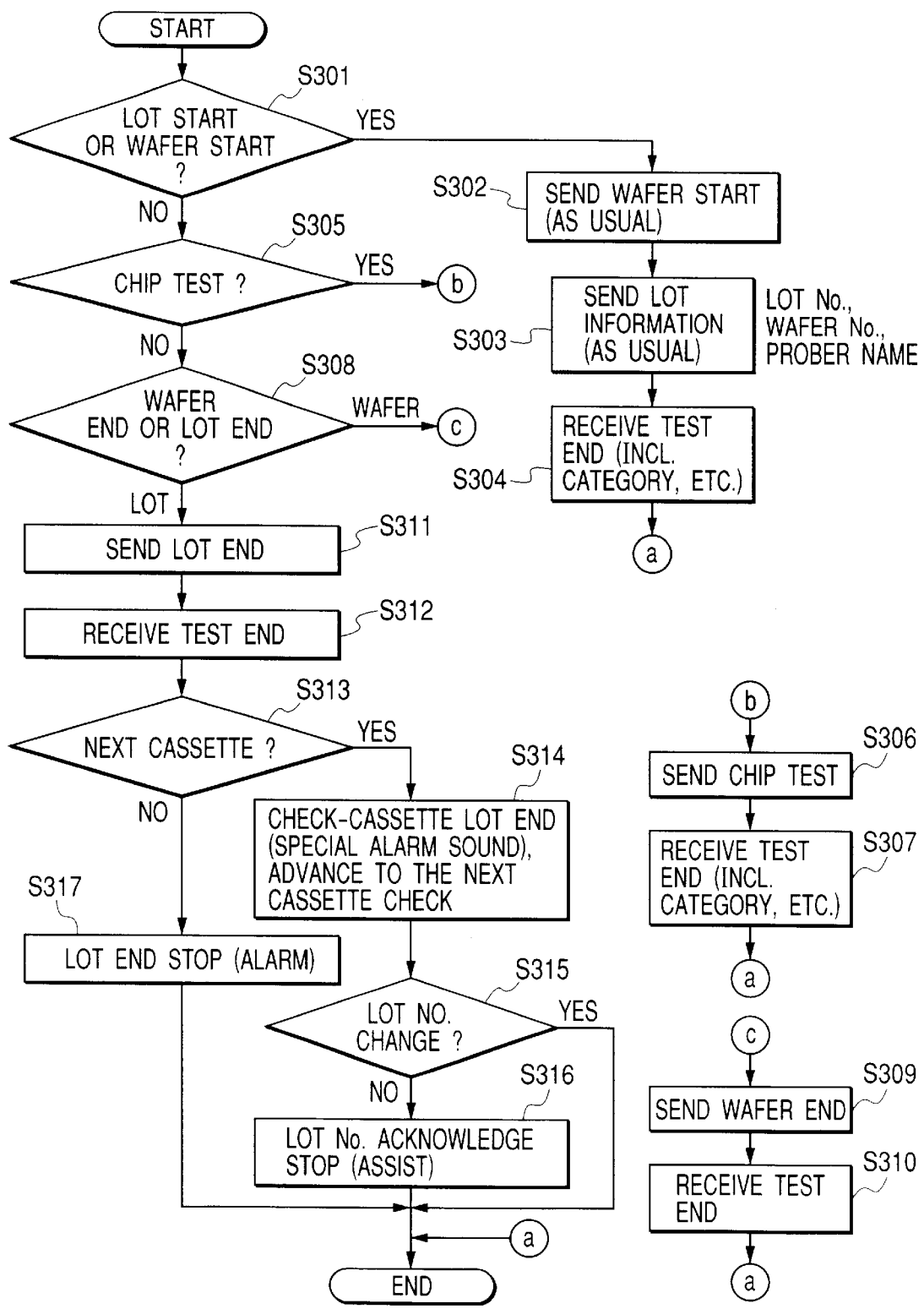
FIG. 7 is a flow chart showing the generation of start signals transmitted from the prober to a tester.

Next, with reference to FIGS. 5 to 7, the following description is provided of an example of the construction and operation of the probers which constitute the probe inspection system of this embodiment. FIG. 5 is a diagram showing a prober, FIG. 6 is a diagram showing a prober operation flow, and FIG. 7 is a flow chart showing the generation of start signals transmitted from the probers to the testers.

As shown in FIG. 5, each prober 1 is made up of a cassette (1) 21, a cassette (2) 22, a wafer:conveyance system 23, and a measurement chuck 24. The prober 1 may be of an existing hardware configuration, but the software thereof has been modified so as to be applicable to a multi-item continuous lot check in the prober and so as to permit an automatic change of item parameters and measurement temperatures corresponding to various items.

The cassette (1) 21 receives therein a plurality of wafers 25 with a predetermined integrated circuit formed thereon in the wafer processing step. The cassette (1) 21 with such plural wafers 25 received therein is set to a predetermined position (the right upper corner in the figure) manually or automatically using a conveyance mechanism.

The cassette (2) 22, like the cassette (1) 21, also receives therein a plurality of wafers 25 with a predetermined integrated circuit formed thereon in the wafer processing step and is set to a predetermined position (the left upper corner in the figure).

The wafer conveyance system 23 moves between the cassettes (1) 21, (2) 22 and the measurement chuck 24, which movement comprises a combination of right- and leftward movements, clockwise and counterclockwise 90-rotations, and expansion and contraction of the chuck in the figure, to convey the wafers 25 received in both cassettes, one by one, to the measurement chuck 24 and to return them to the cassettes after a probe check.

The measurement chuck 24 is used for conducting a probe check (probing a chip) of each of the wafers which are conveyed, one by one, from the cassettes (1) 21 and (2) 22 by means of the wafer conveyance system.

In the prober 1 constructed as described above, for example, as for the cassette (1) 21, the wafer conveyance system 23 positioned centrally in its initial state is moved rightwards, the first wafer out of the plural wafers 25 received in the cassette (1) 21 is taken out by expansion and contraction of a chuck provided in the wafer conveyance system 23, then wafer conveyance system 23 is moved back to its central position and is thereafter turned 90° clockwise, and the wafer 25 is delivered to the measurement chuck 24 by expansion and contraction of the chuck in the wafer conveyance system 23, followed by a probe check. After the end of the probe check, the wafer 25 is delivered from the measurement chuck 24 to the wafer conveyance system 23 by expansion and contraction of the chuck in the same system, then the wafer conveyance system 23 is turned 90° counterclockwise and is thereafter moved rightwards, and the wafer 25 is returned to the cassette (1) 21 by expansion and contraction of the chuck in the wafer conveyance system 23. Subsequently, the above operations are repeated to complete a probe check for all (25 for example) wafers 25 accommodated in the cassette (1) 21 successively from the second wafer, the third, . . . . Also, as for the cassette (2) 22, the same operations as in the case of the cassette (1) 21 are performed, except that the movement of the wafer conveyance system 23 is reversed. That is, the wafer conveyance system 23 positioned centrally in its initial state is moved leftwards, the first wafer out of plural wafers 25 accommodated in the cassette (2) 22 is taken out by expansion and contraction of the chuck in the wafer conveyance system 23, the same conveyance system is returned to its central position and is thereafter turned 90° counterclockwise, the wafer is delivered to the measurement chuck 24 by expansion and contraction of the chuck in the wafer conveyance system 23, and a probe check is conducted. After the end of the probe check, the wafer 25 is delivered from the measurement chuck 24 to the wafer conveyance system 23 by expansion and contraction of the chuck in the same system, the wafer conveyance system 23 is turned 90° clockwise and is thereafter moved leftwards, and the wafer 25 is returned to the cassette (2) 22 by expansion and contraction of the chuck conveyance system 23. By repeating these operations, it is possible to take out, one by one, the wafers 25 accommodated in the cassette (2) 22 and to conduct a probe check for all of the wafers.

In the continuous lot check by the prober 1, as shown in FIG. 6, at a first starting point, the cassette (1) 21 side starts processing, then when this processing has proceeded and the processing on the cassette (1) 21 side is complete, the cassette (2) 22 side starts processing subsequently; then, when this processing has proceeded and the processing on the cassette (2) 22 side is complete, the cassette (1) 21 side starts processing in the same manner as above. Thus, a control is effected so that processings are carried out continuously as long as the cassettes (1) 21 and (2) 22 are set.

As shown in FIG. 7, start signals transmitted from the prober 1 to the tester 2 are generated in the following manner. The start signals include Lot Start, Wafer Start, Chip Test, Wafer End, and Lot End. Lot Start is provided at the time of measuring the first chip on the first wafer in one lot. Wafer Start is transmitted at the first chip on each wafer. Chip Test is transmitted at the second to the last chip on each wafer. This is the case of one-piece measurement. Wafer End is provided after the end of measurement of each wafer. This is called Dummy Start free of any measurement chip. Lot End is provided at the end of measurement of each lot. This is called Dummy Start free of any measurement chip.

After the start, a judgment is made as to whether the start signal is Lot Start or Wafer Start (step S301). If the start signal is found to be Lot Start or Wafer Start as a result of the judgment, the Wafer Start signal is sent as usual to the tester 2 and communication of lot information is carried out as usual (S302, S303). In this communication of lot information, items of information such as lot No., wafer No., and prober name are transmitted to the tester. Subsequently, upon receipt of the Test End signal, including the category, the processive comes to an end (S304).

If the start signal is found to be neither Lot Start nor Wafer Start in step S301, a check is made to see whether the start signal is Chip Test or not (S305). If the answer is affirmative, a Chip Test signal is sent to the tester 2 (S306). Subsequently, upon receipt of the Test End signal, including the category, the processing comes to an end (S307).

If the start signal is found to be not a Chip Test signal in step S305, a check is made to see if the start signal is Wafer End or Lot End (S308). If the answer is Wafer End, the Wafer End signal is sent to the tester 2 (S309). Subsequently, upon receipt of the Test End signal, the processing comes to an end (S310).

If the start signal is found to be Lot End in step S308, the Lot End signal is sent to the tester 2 (S311). After receipt of the Test End signal, a check is made to see if there is a next cassette (S312 and S313). If the answer is affirmative, an alarm is sounded indicating a lot end of the cassette under processing using a special alarm sound, and the flow advances to the processing of the next cassette, in which a check is made to see if there is a change of Lot No. (S314 and S315). If the answer is affirmative, the processing comes to an end; while, if the answer is negative, that is, if there is no change of Lot No., a Lot No. acknowledge stop is asserted, and the processing comes to an end (S316). If it turns out in step S313 that there is not a next cassette, an alarm is given indicating a lot end stop, and the processing comes to an end (S317).

Next, with reference to FIGS. 8 to 13, a detailed description will now be given about various functions in the probe inspection system according to this embodiment. The various functions include automatic program loading, automatic prober's jig change and parameter setting, collection of test results, centralized probe trace management and control, trouble detection and operation monitor, and automatic lot conveyance and lot No. setting.

Figure 8:
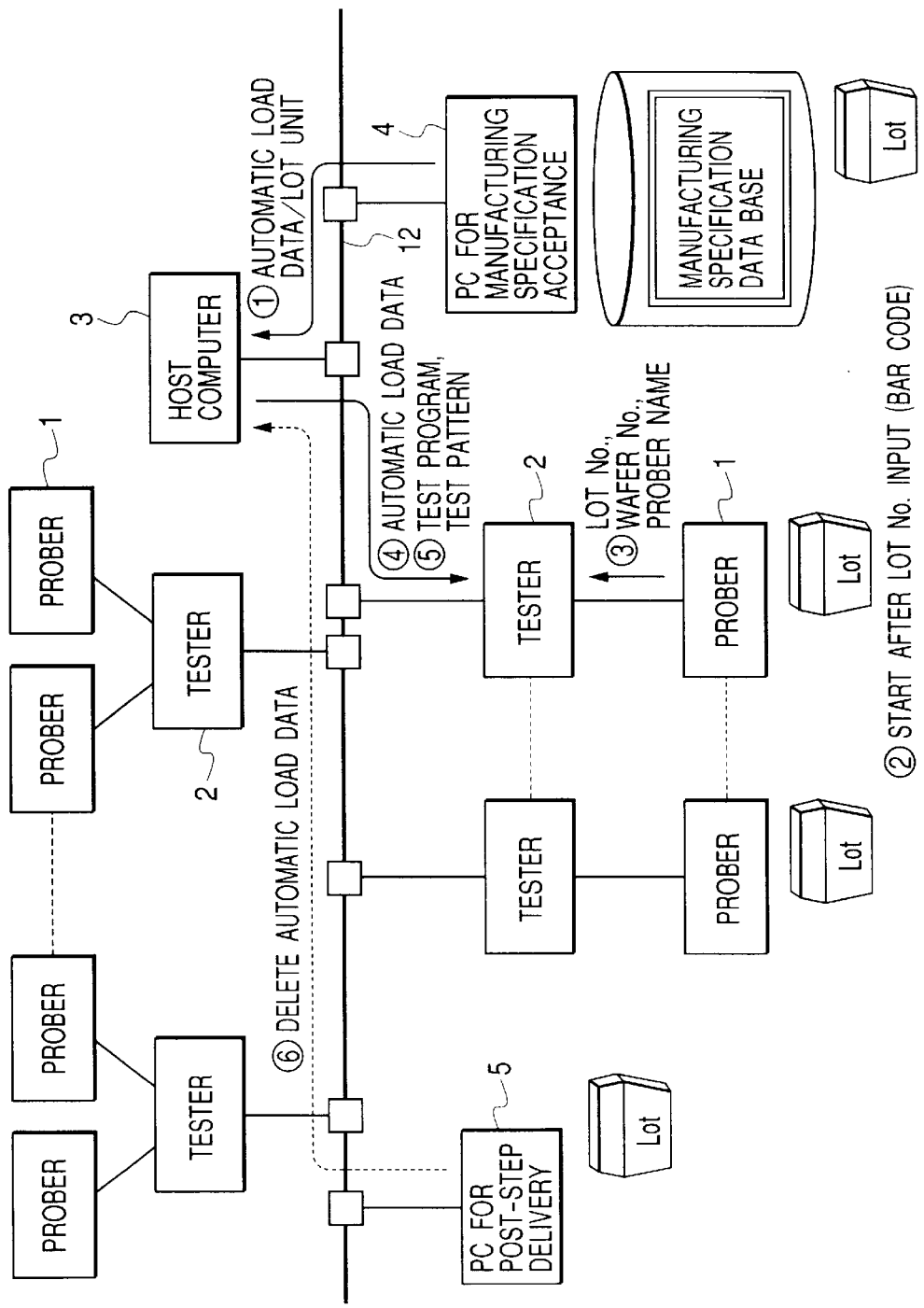
FIG. 8 is a block diagram illustrating an automatic program loading function in the probe inspection system.

First, with reference to FIG. 8, an example of an automatic program loading function will be described. FIG. 8 is a block diagram illustrating an automatic program loading function.

As shown in FIG. 8, the automatic program loading is carried out for plural testers 2 and probers 1, for example, in the configuration including probers 1, testers 2, host computer 3, PC 4 for manufacturing specification-acceptance, and PC 5 for post-step delivery, in the probe inspection system shown in FIG. 4.

(11) A control card is issued at the time of lot acceptance in the wafer testing step. At this time, Automatic load data (manufacturing specification)/Lot unit is transmitted from the PC 4 for manufacturing specification acceptance to the host computer 3 (①).
(12) At the time of starting a probe check, the worker inputs the Lot No. to a prober 1 and starts the inspection (②).
(13) At the time of starting a probe check, items of information, such as lot No., wafer No., and prober name, are transmitted from the prober 1 to the tester 2 (③).
(14) The tester 2 receives automatic load data of the lot concerned from the host computer 3 (④).
(15) The tester 2 loads a test program and a test pattern of the specified lot from the automatic load data and starts a probe check (⑤).
(16) After the end of the probe check, and at the time of outputting a pellet inspection slip (information of a nondefective product), the automatic load data for the host computer 3 is deleted by the PC for post-step delivery (⑥).

Figure 9:
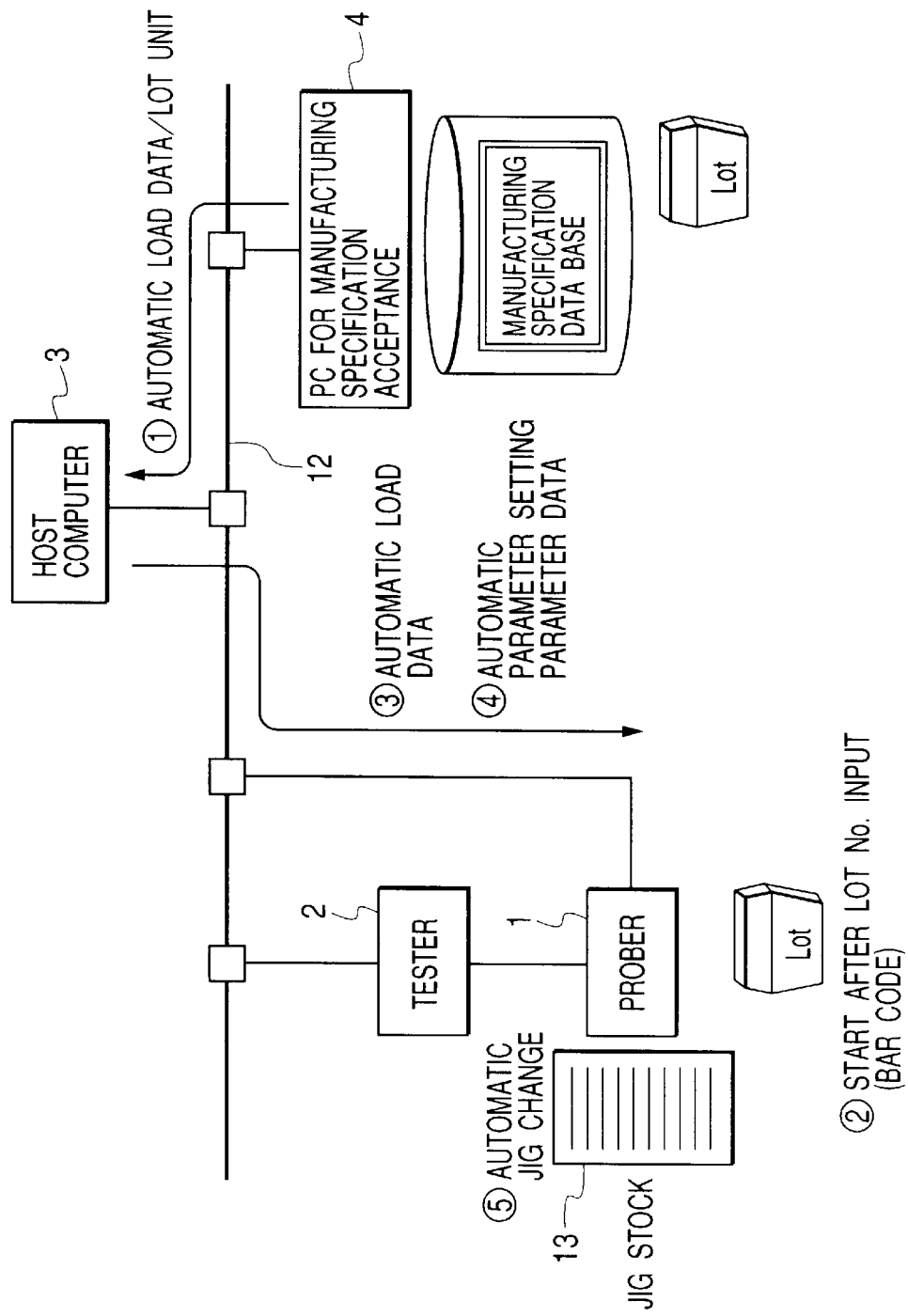
FIG. 9 is a block diagram illustrating automatic jig changing and parameter setting functions of the prober in the probe inspection system.

Next, with reference to FIG. 9, an example of prober automatic jig changing and automatic parameter setting functions will be described. FIG. 9 is a block diagram illustrating both functions. As shown in the figure, the automatic jig change and automatic parameter setting are for plural probers 1, for example, in the configuration including probers 1, testers 2, host computer 3, PC 4 for manufacturing specification acceptance, and jig stock 13, in the probe inspection system shown in FIG. 4.

(21) A control card is issued at the time of accepting a lot in the wafer testing step. At this time, Automatic load data (manufacturing specification)/Lot unit is sent from the PC 4 for manufacturing specification acceptance to the host computer 3 (①).
(22) At the time of starting the probe check, the worker inputs the Lot No. to the prober 1 and starts inspection (②).
(23) The prober 1 receives automatic load data of the specified lot from the host computer 3 (③).
(24) When there is any parameter change based on the automatic load data, the prober 1 receives parameter data from the host computer 3 and effects switching automatically (④).
(25) When there is any jig change based on the automatic load data, the prober 1 takes out jig data from the jig stock 13 and effects switching automatically (⑤).

Next, an example of the test result collecting function will be described with reference to FIG. 10, which is a block diagram illustrating this function.

Figure 10:
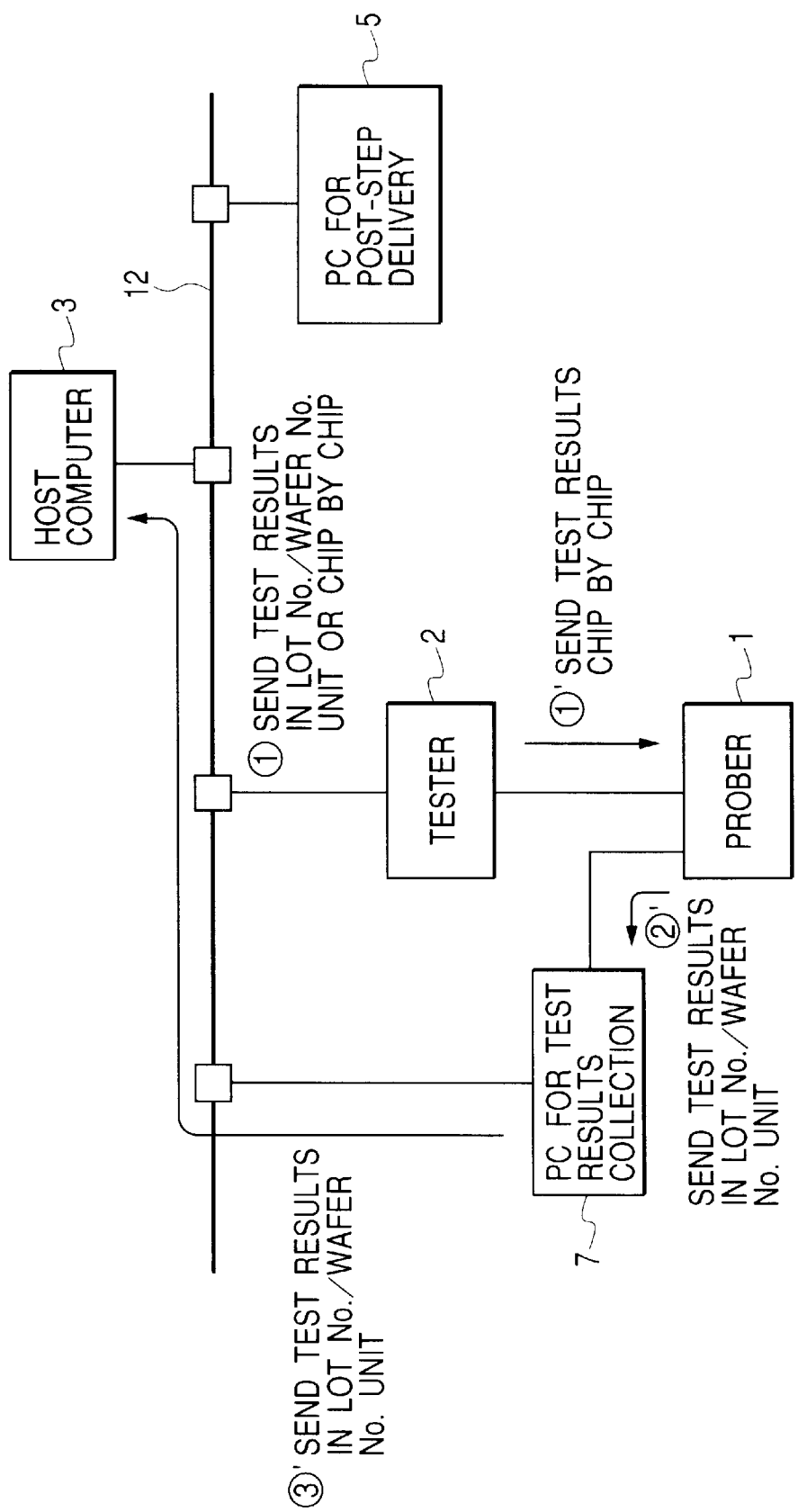
FIG. 10 is a block diagram illustrating a test results collecting function in the probe inspection system.

As shown in FIG. 10, the collection of test results is carried out for plural testers 2 and probers 1, for example, in the configuration including probers 1, testers 2, host computer 3, and PC 7 for test result collection, in the probe inspection system shown in FIG. 4. With on-line to the post-step, the PC 5 for post-step delivery becomes unnecessary as the case may be. In this collection of test results, there mainly is adopted a method involving transmission of test results from each tester 2 to the host computer 3, but it is also possible to adopt a method involving transmission of test results from the PC 7 for test result collection to the host computer 3. If test results are to be stored in another medium, such as a FD, this can be done using the PC 5 for post-step delivery or PC 7 for test result collection.

The former method of transmitting test results from each tester to the host computer 3 is carried out in the following manner.

(31) The tester 2 transmits test results to the host computer 3 in lot No./wafer No. unit or chip by chip (①).

On the other hand, the latter method of transmitting test results from the PC 7 for test results collection to the host computer 3 can be carried out in the following manner.

(31') The tester 2 transmits test results chip by chip to the prober 1 (①').
(32') The prober 1 transmits test results in lot No./wafer No. unit to the PC 7 for test result collection (②').
(33') The PC 7 for test result collection transmits the test results provided from the prober 1 to the host computer 3 in lot No./wafer No. unit (③').

Next, an example of the probe trace centralized management and control function will be described with reference to FIG. 11, which is a block diagram illustrating this function.

Figure 11:
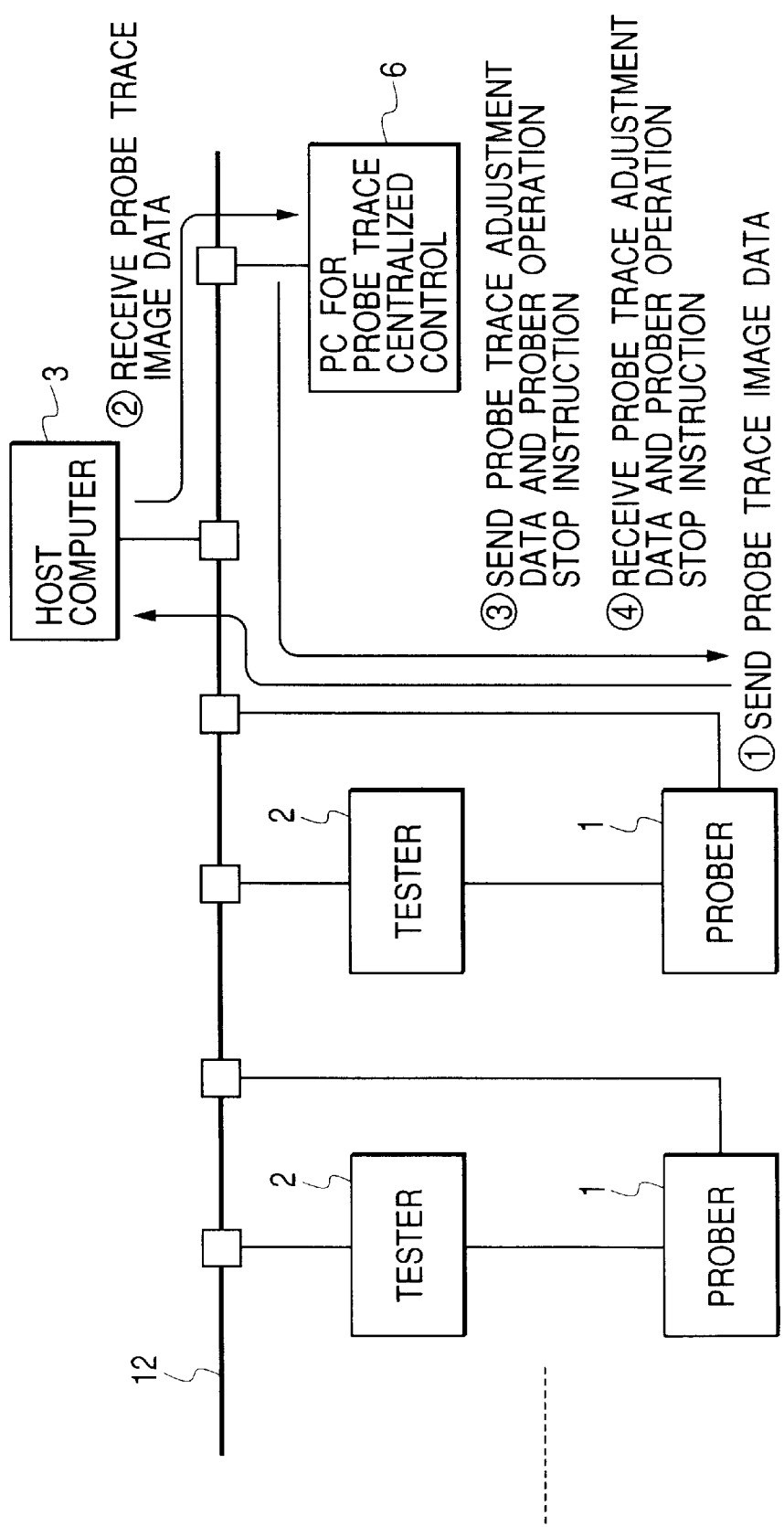
FIG. 11 is a block diagram illustrating a probe trace centralized management and control function in the probe inspection system.

As shown in FIG. 11, the probe trace centralized management and control is carried out for plural probers 1, for example, in the configuraiton including probers 1, testers 2, host computer 3, and PC 6 for probe trace centralized management, in the probe inspection system shown in FIG.

4. The probe trace centralized management and control is usually not performed for the improvement of running throughput, as in the continuous lot check, but is performed in a temporary wait state on a specific occasion such as lot switching, jig switching, or set temperature switching. A probe check is started after confirmation of a probe trace.

(41) During the probe check, the probe trace image is filed at a predetermined frequency by the prober 1 and the resulting image file is sent to the host computer 3 (①). This image file also contains such items of information as the No. of each prober 1, the Lot No. and the Wafer No.

(42) The PC for probe trace centralized management constantly receives and displays the image provided from the prober 1 (②). Here, an acknowledging is carried out by on-line communication.

(43) The worker who has acknowledged the probe trace sends adjustment data from the probe trace image to the prober 1 through the PC 6 for probe trace centralized management (③). Together with this data transmission, it is also possible to transmit an operation stop instruction for the prober 1.

(44) Upon receipt of the adjustment data, the prober 1 corrects the probing position (④). It is also possible for the prober 1 to receive an operation stop instruction.

(45) The above operations (41) to (44) are repeated until the end of the probing work.

(46) The probe trace image is managed and preserved in a lot/wafer unit within a disc of the host computer 3. For the acknowledgment of a probe trace at the time of jig change and parameter change, a dummy chip is provided and set in advance.

Next, an example of the trouble detection/operation monitor function will be described below with reference to FIG. 12, which is a block diagram illustrating this function.

Figure 12:
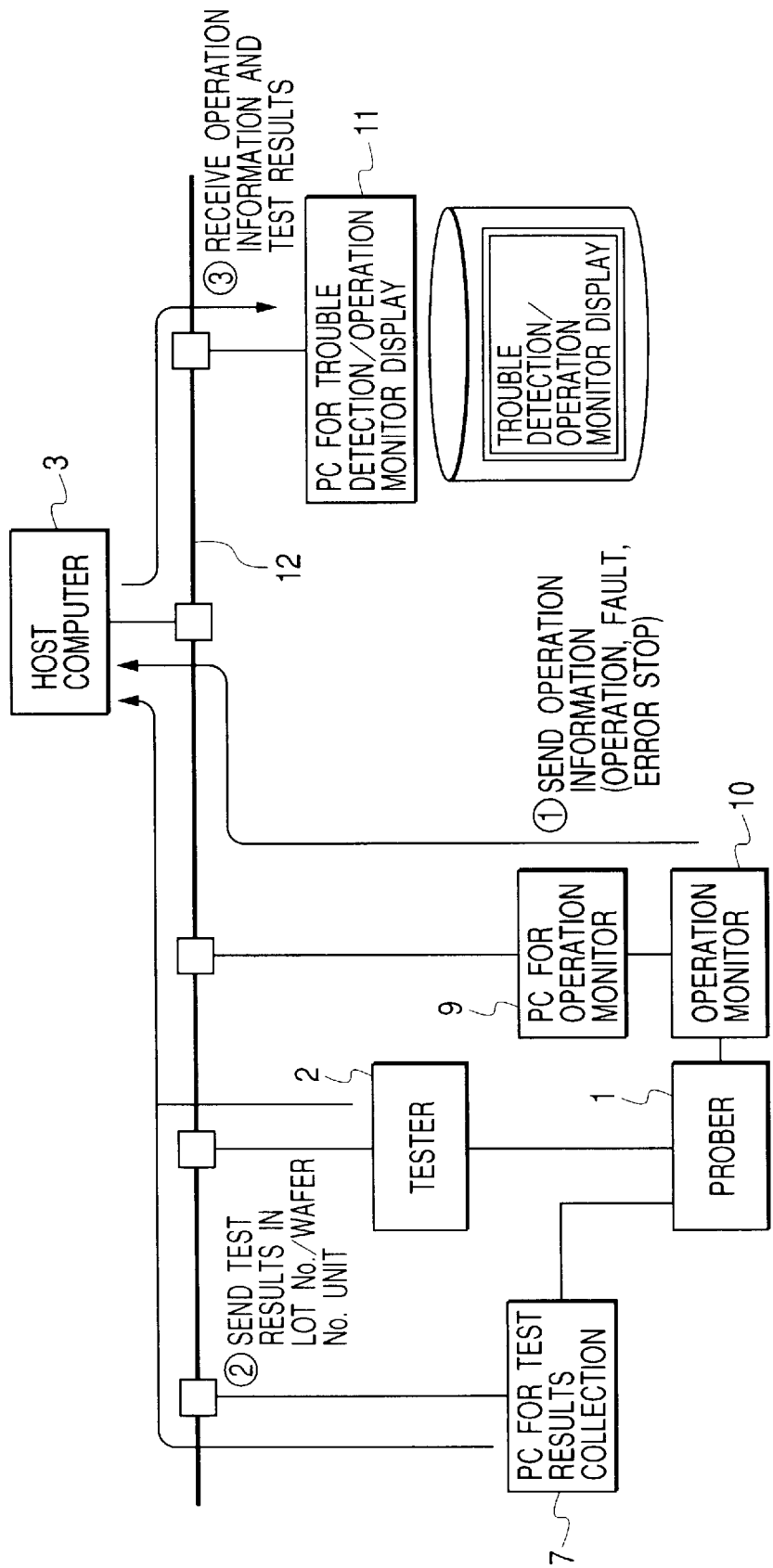
FIG. 12 is a block diagram illustrating a trouble detecting and operation monitoring function in the probe inspection system.

As shown in FIG. 12, the trouble detection and operation monitor process is carried out for plural testers 2 and probers 1, for example, in the configuration including probers. 1, testers 2, host computer 3, PC 7 for test results collection, PC 9 for operation monitor, operation monitors 10, and PC 11 for trouble detection/operation monitor display. The trouble detecting function is carried out for detecting troubles such as probe contact imperfection and a lowering of the yield on a real time basis from the test results information provided to the host computer 3 from each tester 2 or the PC 7 for test results collection.

(51) The operation monitors 10 each send items of information, such as operation, fault (including faults of testers and probers) and error stop, constantly to the host computer 3 through the PC 9 for operation monitor (①).

(52) The PC 7 for test result collection or each tester 2 sends test result information to the host computer 3 in lot No./wafer No. unit on a real time basis (②).

(53) The PC 11 for trouble detection/operation monitor display receives and displays operation information and trouble information of test results (③). Next, an example of the automatic lot conveying and lot No. setting function will be described with reference to FIG. 13, which is a block diagram illustrating this function.

Figure 13:
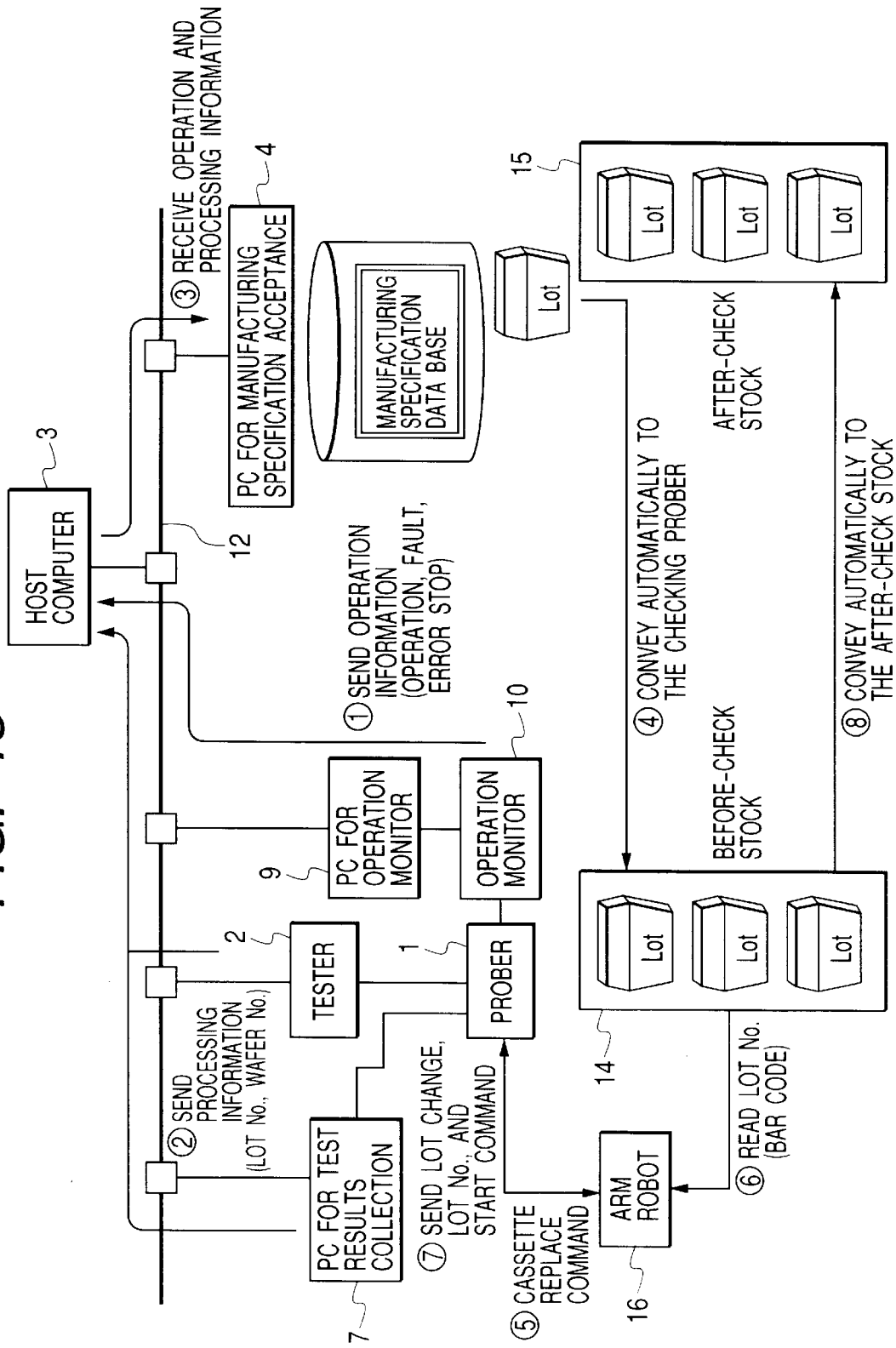
FIG. 13 is a block diagram illustrating automatic lot conveying and lot No. setting functions in the probe inspection system.

As shown in FIG. 13, the automatic lot conveying and lot No. setting function is carried out for plural testers 2 and probers 1, for example, in the configuration including probers 1, testers 2, host computer 3, PC 4 for manufacturing specification acceptance, PC 7 for test results collection, PC. 9 for operation monitor, and operation monitors 10, in the probe inspection system shown in FIG. 4, and further including a before-check stock 14, an after-check stock 15, and an arm robot 16.

(61) Each operation monitor 10 transmits information, such as operation, fault (including faults of testers 1 and probers 1), and error stop, constantly to the host computer 3 (①).

(62) When the processing is over in the unit of a wafer, the PC 7 for test result collection or each tester 2 transmits processing information, such as lot No. and wafer No. (②).

(63) The PC 4 for manufacturing specification acceptance receives items of information, such as operation, fault and error stop, as well as wafer processing information (data of the above 61 and 62) (③).

(64) The PC 4 for manufacturing specification acceptance anticipates a lot completion time of each prober 1 and a loading jig and provides a checking prober 1 with an automatic conveyance command for a cassette acceptance, lot stocked in the before-check stock 14 (④).

(65) Upon completion of the lot processing, the prober 1 issues a cassette replace command to the arm robot 16 (⑤).

(66) The arm robot 16 reads the lot No. (⑥).

(67) The arm robot 16 sends a lot change, lot No. and probe check start command to the prober 1 (⑦).

(68) The cassette of the lot for which the probe check has been completed is conveyed to the after-check stock 15 automatically (⑧).

The functions described above, i.e., automatic program load, prober's automatic jig change, automatic parameter setting, collection of test results, probe trace centralized management and control, trouble detection and operation monitor, and automatic lot conveyance and lot No. setting, are all required in a case where the interior of the wafer testing step is unmanned and the prober's software is modified to effect a continuous lot check for a variety of items, but in a case of performing only a continuous lot check for a variety of items without the interior being unmanned, such functions as automatic program load, prober's automatic jig change and automatic parameter setting, and test result collection are essential. It is not always necessary to provide such functions as probe trace centralized management and control, trouble detection and operation monitor, and automatic lot conveyance and lot No. setting, but the provision of those functions will be more effective. In case of performing a continuous lot check while fixing an item, only the test result collecting function is essential, and as to the other functions, the provision thereof will be more effective.

Thus, according to the semiconductor integrated circuit device fabricating method of this embodiment, the following effects can be obtained by connecting, through the network 12, all of the probers 1, testers 2, host computer 3, PC 4 for manufacturing specification acceptance, PC 5 for post-step delivery, PC 6 for probe trace centralized control, PC 7 for test results collection, PC 9 for operation monitor, operation monitors 10, and PC 11 for trouble detection/operation monitor display.

(1) By managing the manufacturing specification in the probe inspection step unitarily in the unit of a lot or wafer as automatic load data, the manufacturing specification information including a probe check test program and test pattern can be fed to each tester 2 automatically.

(2) In each tester 2, it is possible to select required information, such as a test program and test pattern, on the basis of automatic load data in the probe check, and it is also possible to automatically change the item parameter and measurement temperature in each prober 1, which change can also be done by the prober alone.

(3) By managing test results in the network 12 using the PC 7 for test result collection, etc. connected thereto, it is possible to abolish the storage of probe check results in a storage medium and collect probe check results continuously.

(4) By automating the lot switching work in each prober 1 in terms of a continuous operation, the lot switching work can normally be done automatically, whereby the time required for the lot switching work can be shortened, the waiting time of the workers can be reduced, and the tester stop time can be made zero.

(5) Since automatic load data can be managed in the unit of a lot within a cassette in terms of a representative lot No., even when plural lots and plural items are accommodated within one cassette, it becomes possible to automatically change the test program and lot No., so that it is possible to reduce the number of cassettes, reduce the working load, and improve the working efficiency.

(6) In the probe inspection step, test programs corresponding to various items can be changed automatically at the time of changing lots, so that the method in question can be applied particularly to a multi-item production in the prober.

(7) Since it is possible to reduce the working time in the probe inspection step, it is possible to reduce the number of workers needed in the wafer testing step and.further realize an unmanned construction.

(8) A trouble of test results and the operating condition of each tester can be checked on a real time basis.

(9) A machine No. for an accepted lot can be indicated easily.

Although the present invention has been described above specifically by way of various embodiments thereof, it goes without saying that the present invention is not limited to those embodiments and that various modifications may be made within a scope not departing from the gist o f the invention.

The following is a brief description of effects obtained by typical aspects of invention.

(1) By building a network including probers, testers, manufacturing specification management, testing step control and test result management, and by modifying the prober software, plural lots of various items can be probe-checked continuously, prober by prober, so that it is possible to surely (quantitatively) diminish the waiting time of workers and the working load, with consequent improvement of the tester working efficiency.

(2) Since a network is constructed and plural lots and items can be accommodated within a single cassette to effect probe inspection, the resulting decrease in the number of cassettes and in the working load permits improvement of the tester working efficiency.

What is claimed is:

1. A method of testing a semiconductor integrated circuit device, comprising the steps of:

(a) providing a wafer with a predetermined integrated circuit formed thereon;

(b) subjecting the wafer with the integrated circuit formed thereon to an electrical characteristic test while checking off-line probe test image data of a prober for the wafer; and (c) regarding as products chips judged to be non-defective as a result of the electrical characteristic test.

2. The method according to claim 1, wherein in the step of conducting the electrical characteristic test, a probing position of the prober is acknowledged, corrected and controlled on a network on the basis of the result of having checked the probe trace image data.

3. The method according to claim 2, wherein the electrical characteristic test is probe check.

* * * * *